United States Patent [19]

Koguchi et al.

[11] Patent Number: 4,814,244

[45] Date of Patent: Mar. 21, 1989

[54] METHOD OF FORMING RESIST PATTERN ON SUBSTRATE

[75] Inventors: Toshio Koguchi; Haruo Kinoshita, both of Tokyo, Japan

[73] Assignee: NEC Corporation, Japan

[21] Appl. No.: 159,687

[22] Filed: Feb. 24, 1988

[30] Foreign Application Priority Data

Feb. 24, 1987 [JP] Japan ................... 62-41876

[51] Int. Cl.[4] ............................................. G03C 5/00
[52] U.S. Cl. .......................................... 430/30; 430/5; 430/296; 430/311; 430/325; 430/326; 430/328; 430/329; 437/229; 250/492.2; 250/492.3
[58] Field of Search .................... 430/5, 30, 296, 311, 430/325, 326, 328, 329, 942; 437/229; 250/492.21, 492.3; 156/643

[56] References Cited

U.S. PATENT DOCUMENTS 4,341,592 7/1982 Shortes et al. .................... 156/643

FOREIGN PATENT DOCUMENTS 0061350 9/1982 European Pat. Off. ........... 430/296
141133 6/1986 Japan ................................. 430/296

Primary Examiner—José G. Dees
Attorney, Agent, or Firm—Laff, Whitesel, Conte & Saret

[57] ABSTRACT

A method of forming resist pattern is disclosed. After the resist pattern is formed, an ion beam is irradiated on the resist pattern. The energy of the ion beam is controlled in every segments of the resist pattern by a predicted deviation data stored beforehand, so that the unfavorable deviation of the resist pattern is minimized.

8 Claims, 12 Drawing Sheets

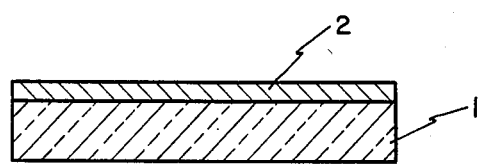
FIG. IA
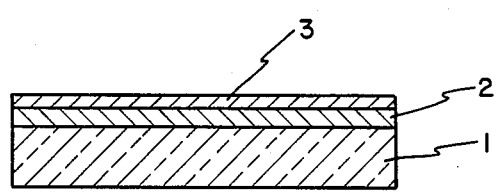
FIG. IB
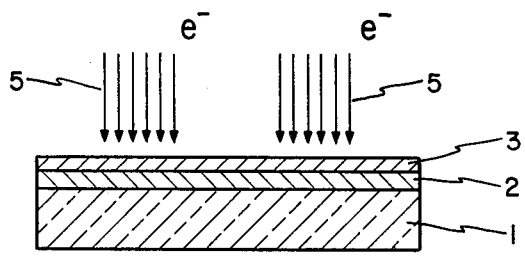
FIG. IC
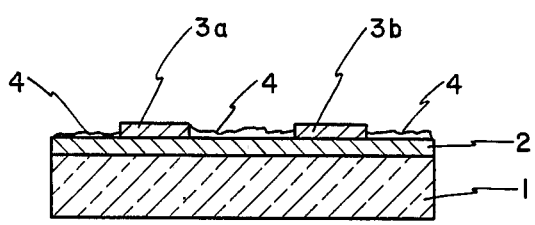
FIG. ID
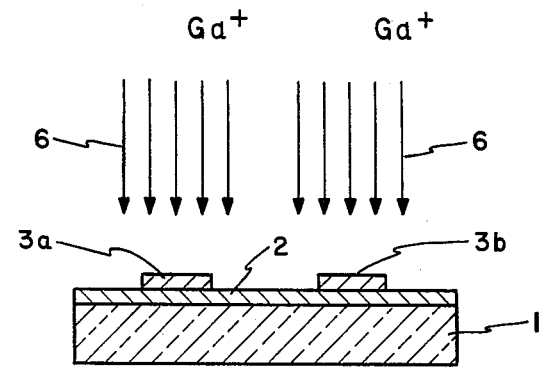
FIG. IE
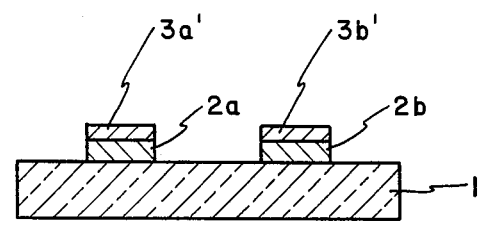
FIG. IF
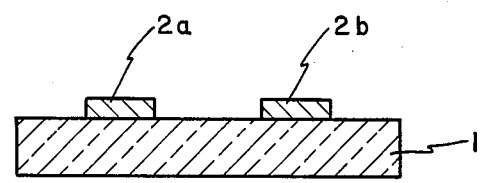
FIG. IG $W_1$ (DIMENSION: μm)

$W_1$ (DIMENSION: μm)

$W_2$ (DIMENSION: μm)

$W_2$ (DIMENSION: μm)

METHOD OF FORMING RESIST PATTERN ON SUBSTRATE

BACKGROUND OF THE INVENTION

The present invention relates to a method of forming a resist pattern on a substrate, and more particularly, to a method of forming a resist pattern on a metal layer provided on a glass substrate to produce a mask for manufacturing a semiconductor device.

The resist pattern is widely used in the field of semiconductor device. For example, the mask for manufacturing the semiconductor device is produced by following process steps: depositing a metal layer such as a chromium layer on a major surface of the glass substrate, coating a resist film on the metal layer, selectively exposing the resist film by an electron beam, etc., developing the resist film to form the resist pattern, and selectively etching the metal layer by using the resist pattern as an etching mask. On the other hand, in the manufacturing process steps for the semiconductor device, the resist pattern is formed on a conductive layer such as a polycrystalline silicon layer or an aluminum layer or on a insulating layer provided on a semiconductor substrate, that is, a semiconductor wafer, and selectively etching the conductive layer or the insulating layer by using the resist pattern as an etching mask to form electrode wirings or contact holes. In any cases, a precise resist pattern is necessary over the entire area.

However, even if the resist pattern has a precise and designed dimension at one portion, at other portions on the same substrate, the dimensions of the resist pattern are inevitably deviated to some extent from the designed value. The deviation is caused by the previous process steps of coating the resist film, selectively exposing the resist film and developing the resist film. If many specimens (mask substrates or semiconductor wafers) are treated in substantially identical apparatus and with substantially identical conditions in each process step, the specimens have the same distribution of the deviation in the resist pattern over the entire areas, each other. For example, if the resist pattern of one specimen becomes 0.2 μm broader than the designed value at one portion, the other specimens have the same tendency that the respectively resist patterns become about 0.2 μm broader at the corresponding portions. In the prior art, more precise resist pattern over the entire areas cannot be obtained. To realize a high integrated semiconductor device having a fine pattern, the deviation of the dimension in the resist pattern must be compensated over the effective areas of the substrate entirely.

SUMMARY OF THE INVENTION

Accordingly, an object of the present invention is to provide a method for forming resist pattern on a substrate in which the unfavorable deviation of the resist film can be minimized.

According to the present invention, the method comprises steps of forming a layer to be selectively etched on one major surface of a substrate, coating the surface of the layer with a resist film, selectively exposing the resist film, developing the resist film to form a resist pattern, and irradiating an ion beam on the resist pattern, the energy of the ion beam being changed at every segment areas of the resist pattern on the basis of predicted deviation distribution data of the resist pattern caused by the previous process steps so that the deviation of the resist pattern by the previous process steps is compensated and minimized. The previous process steps include coating the resist film and developing the resist film. When an electron beam exposure is employed. The selectively exposing process step is further included in the previous process steps. The layer to be selectively etched by using the resist pattern as an etching mask may by a chromium layer and/or a chromium oxide layer and the substrate may be a glass plate transparent to UV light or soft-X-rays of a mask for manufacturing a semiconductor device. The layer may be a conductive layer made of polycrystalline silicon, aluminum, etc. or an insulating layer made of silicon oxide, silicon nitride, etc., and the substrate may be a semiconductor wafer such as a silicon wafer. Further, the substrate is a membrane including, for example, an insulating film such as a silicon oxide film and/or a silicon nitride film of a mask for X-ray lithography.

BRIEF DESCRIPTION OF THE DRAWINGS

FIGS. 1A to 1G are cross-sectional views showing process steps in sequence according to an embodiment of the present invention;

EMBODIMENT OF THE INVENTION

Figure 2:
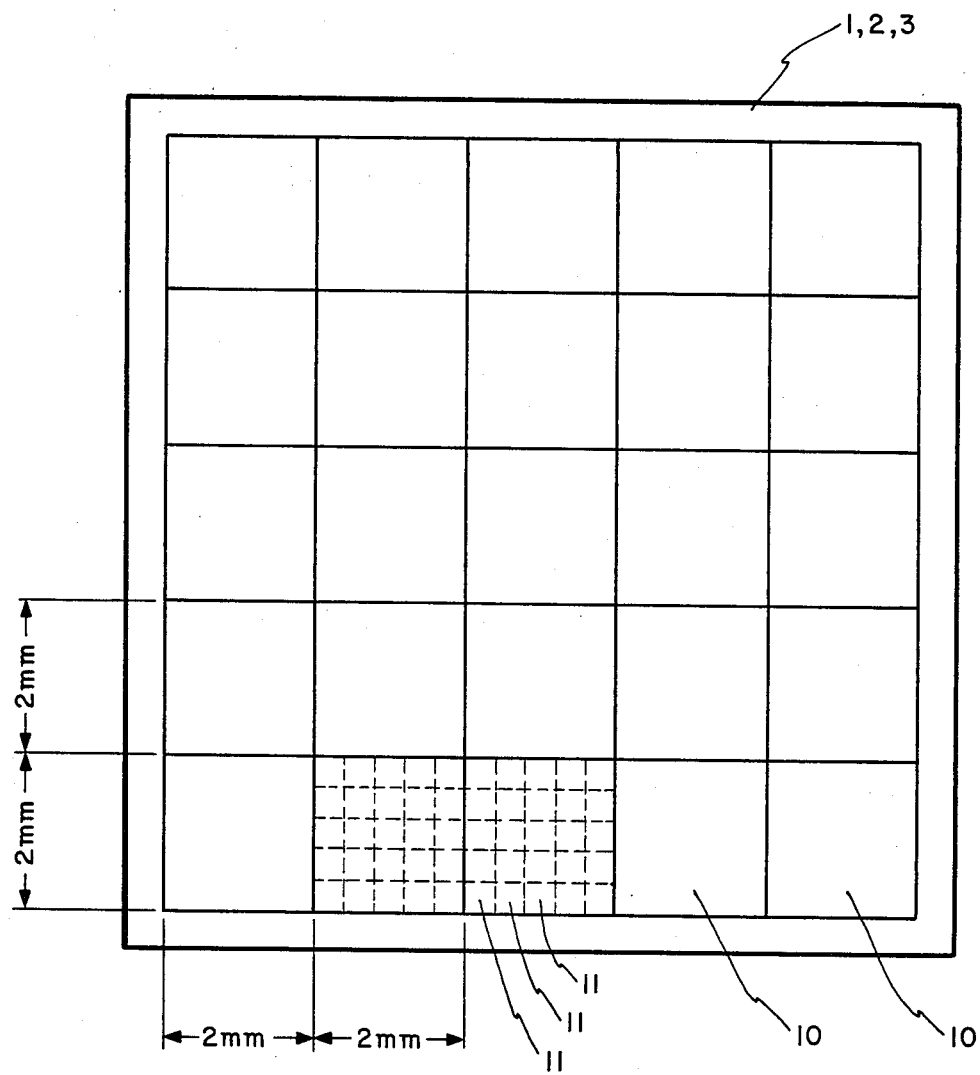
FIG. 2 is a plan view showing a mask which is conducted an electron beam exposure on the resist film.

Referring to FIGS. 1A to 1G, a method of manufacturing a photo-mask according to the present invention is disclosed. A chromium layer 2 is deposited on a major surface of a glass substrate 1 (FIG. 1A), and on the chronium layer a resist film 3, for example, OEBR-100 made by Tokyo Ohka Kogyo Co., Ltd. having the thickness of 6000 Å is coated by a spin-coating method (FIG. 1B). The resist film 3 is subjected to selective exposing of an electron beam (e$^-$) 5 (FIG. 1C), and thereafter the resist film 3 is developed to form resist patterns 3a, 3b where the electron beam has been irradiated (FIG. 1D). Each of resist patterns 3a, 3b deviates its plan shape from the designed value, and a minute resist 4 remains unfavorably between the patterns. The deviation of the resist pattern is caused by the selectively exposing process step by an electron beam, the coating process step and the developing process step. Then, as shown in FIG. 1E, a Ga+ ion beam 6 is irradiated on the resist patterns 3a, 3b. The energy of the ion beam 6 is control by a predicted deviation distribution data and changed its energy in respective portions on the substrate. For example, when the resist pattern on one portion is predicted to be 0.1 μm wider than the designed value, the energy is control to remove the side surfaces and the upper surface of the resist pattern by 0.05 μm. On the other hand, if the resist pattern on other portion is predicted to be 0.2 μm wider than the designed value, the energy, that is, the accelerating voltage is changed to a higher level and the resist pattern is removed at side and upper surfaces thereof by 0.1 μm. During the ion beam irradiation process, the remaining minute resist 4 can be completely removed. Thereafter, the chromium layer 2 is selectively etched by using the compensated resist patterns 3a', 3b' as an etching mask to form metal patterns 2a, 2b (FIG. 1F), and by removing the resist patterns 3a', 3b', a photo-mask including the transparent glass plate 1 and the opaque metal patterns 2a, 2b can be completed (FIG. 1G).

Figure 3A:
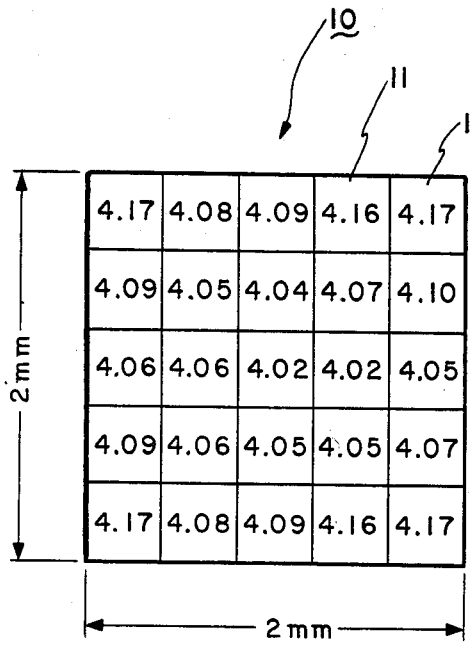
FIGS. 3A and 3B are tables showing the deviation of the resist pattern width $W_1$ in one field, respectively, caused by the process step of selectively exposing the resist film by an electron beam exposure.
Figure 3B:
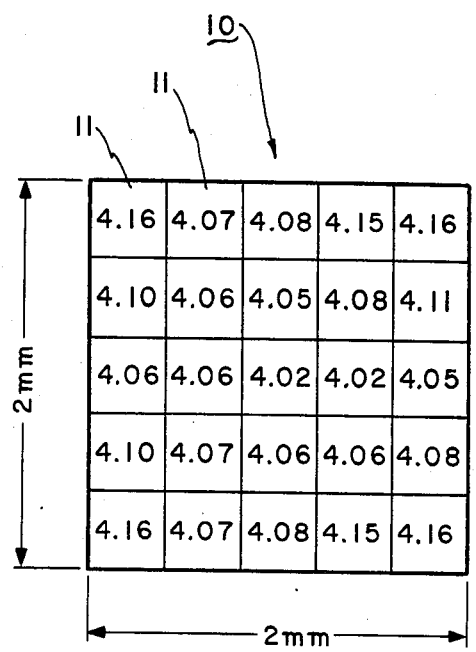
Figure 4A:
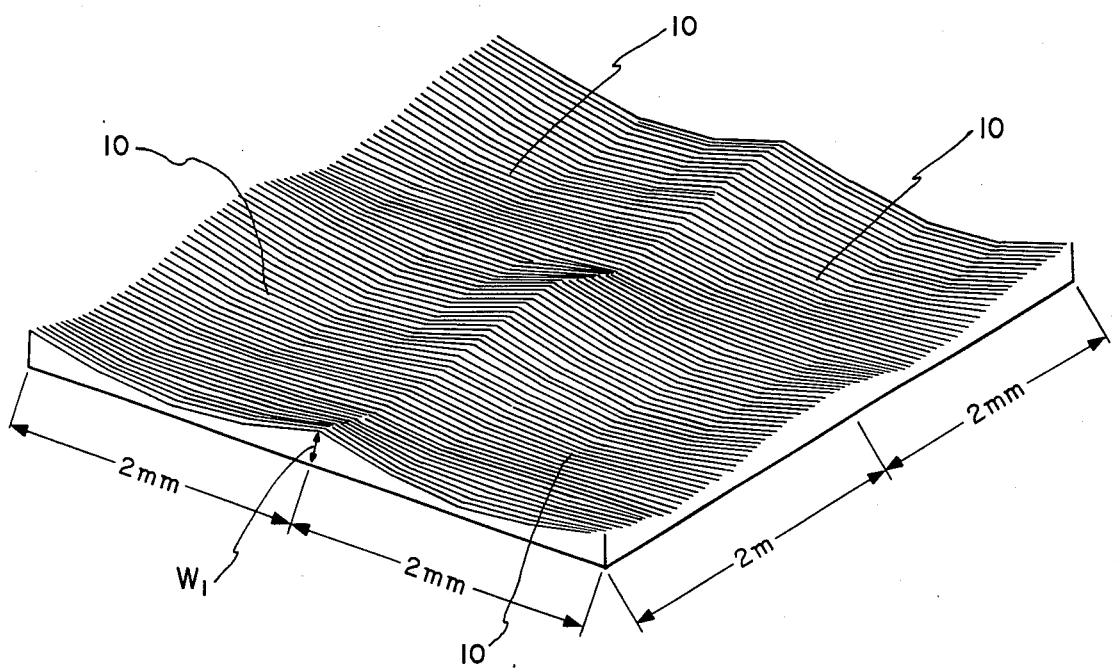
FIGS. 4A and 4B show the deviation of the resist pattern width $W_1$ in adjacent four fields, respectively, caused by the process step of selectively exposing the resist film by the electron beam exposure.
Figure 4B:
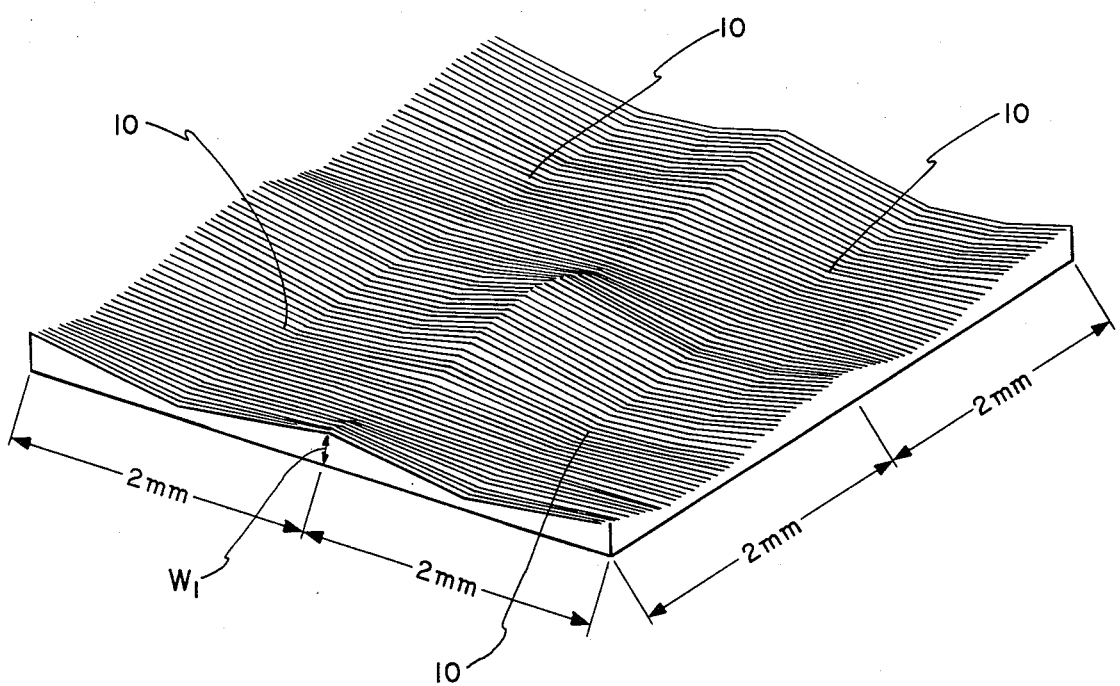

Referring to FIG. 2, when the electron beam exposure is employed in the selectively exposing the resist film 3 on the substrate 1, the entire area is divided into a plurality of small areas 10 (hereinafter called as field). In FIG. 2, each field 10 has the 2 mm×2 mm size and it can be regarded, for example, as one chip area of the semiconductor device. Each of fields is set, in sequence, under an electron beam system by an X-Y stage on which the mask substrate 1 is installed. When one field is subjected to the selective exposure, the X-Y stage stops its movement and the electron beam is scanned within the field area (2 mm×2 mm) by the deflection system. At the center part of the field, the electron beam is irradiated along a passage normal to the surface of the resist film, and at the peripheral part of the field, it is irradiated along a passage inclined from the normal passage. Therefore, the exposure conditions at the center part and the peripheral part become inevitably different. If the condition at the center part is set to obtain the designed value, the condition of the peripheral part cannot be optimized and the resist pattern therein deviates from the designed value. The deviation of the resist pattern caused by the electron beam exposure depends on the electron-beam scanning within one field as mentioned above. Therefore, any fields in any masks treated in an identical apparatus can be expected to have the same tendency of the deviation. FIGS. 3A, 3B, 4A and 4B show the examination results of the resist pattern width deviation caused by the electron beam exposure. FIGS. 3A and 4A are of the same one mask, and FIGS. 3B and 4B are of the different one mask. In FIGS. 3A and 3B, each field 10 is divided into 25 segments 11 of 0.4 mm×0.4 mm, and in the respective segments 11 the width $W_1$ are estimated. In FIGS. 4A and 4B, the resist pattern widths $W_1$ are vertically shown in adjacent four fields 10, respectively. Clearly from these FIGS. 3, 4, the substantially equal tendency of the deviation by the selective exposing process step in each field can be confirmed.

Figure 5A:
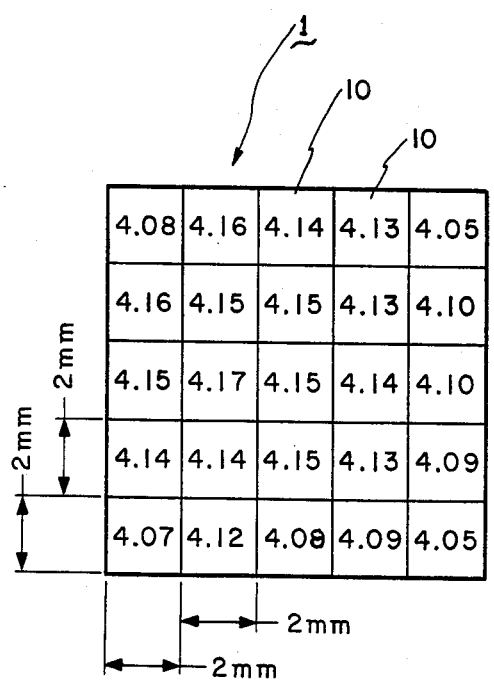
FIGS. 5A and 5B are tables showing the deviation of the resist pattern width $W_2$ in an entire area of one mask, respectively, caused by process steps of coating and developing the resist film.
Figure 5B:
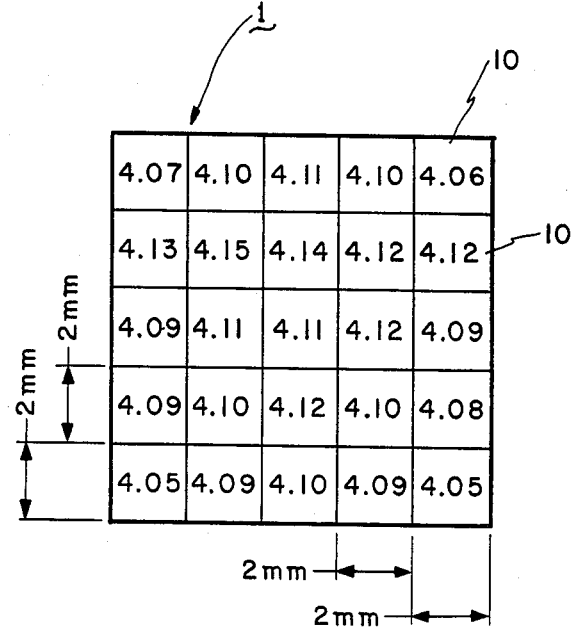
Figure 6A:
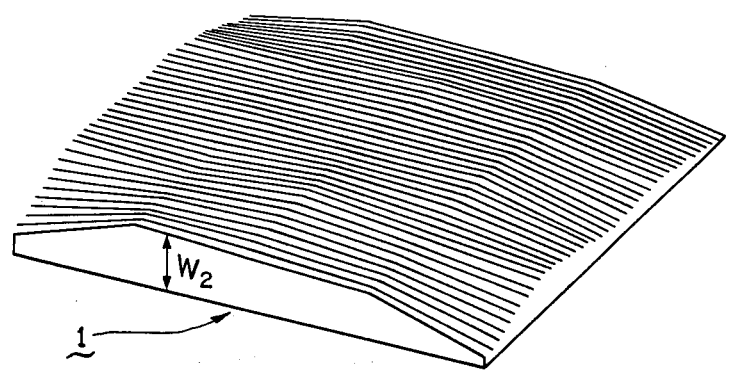
FIGS. 6A and 6B show the deviation of the resist pattern width $W_2$ in one mask, respectively, caused by process steps of coating and developing the resist film.
Figure 6B:
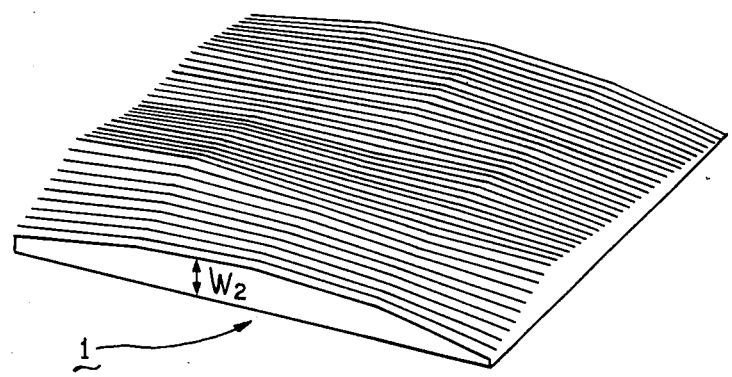

By a spin-coating of the resist film in which the resist is dropped at the center of the substrate and the substrate is rotated at 1000 to 5000 rpm, the thickness of the resist film at the peripheral portion of the substrate becomes thicker than that of the center portion of the substrate by 100 to 500 Å in any substrates. By a spray-type developing in which the substrate is rotated at 100 to 1000 rpm and the developer is sprayed on the resist film, the development condition at the peripheral portion of the resist film differs from the development condition at the center portion thereof. However, the difference can keep the substantially same tendency among a plurality of substrates (makss) if they are treated in an identical apparatus. Therefore, the deviation of the resist film pattern caused by coating and developing process steps of the resist film can be expected to have the same tendency among a plurality of masks. Referring to FIGS. 5A, 5B, 6A and 6B, the examination results of the resist pattern width deviation caused by coating and developing process steps are shown. FIGS. 5A and 6A are of the same one mask, and FIGS. 5B and 6B are of the different one mask. In FIGS. 5A and 5B, the pattern widths $W_2$ are examined at one point in every fields 10. The point at which the width is examined in each field 10 is located at the same position in each field to reject the influence of the exposing process step mentioned above. In FIGS. 6A and 6B, the resist pattern widths $W_2$ are vertically shown in a part of the respective mask specimens 1. Clearly from these FIGS. 5, 6, the substantially equal tendency of the deviation by the coating and developing process steps in each mask specimen can be confirmed.

Figure 7:
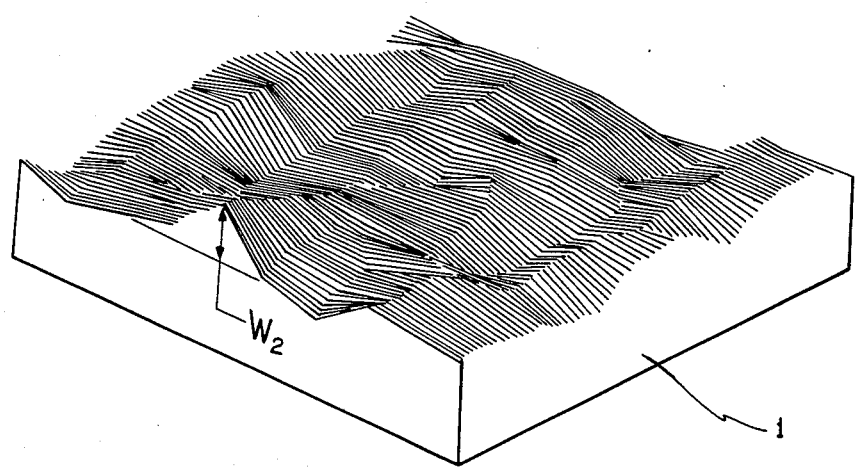
FIG. 7 shows a predicted deviation distribution of the resist pattern width W caused by the previous process steps including selectively exposing the resist film by the electron beam exposure, coating the resist film and developing the resist film.

A predicted deviation data $P_V$ of the resist pattern can be obtained by combining the experimental data of FIG. 3 and the experimental data of FIG. 5. In this case, the resist pattern over the effective substrate area is divided to 625 (25×25) segments 11 (FIG. 2), and in each segment 11, one predicted deviation datum is provided, though not shown in Table. That is, the predicted deviation data $P_V$ includes 625 predicted deviation values. The ion beam is irradiated with a constant energy, that is, a constant accelerating voltage within one segment, and changed its energy, if necessary, when the other segment is irradiated. Referring FIG. 7, the predicted deviation distribution data $P_V$ of the resist pattern, that is, the predicted widths W, which are vertically shown, at respective portions of the substrate is exemplified. The predicted deviation data $P_V$ is used to control the accelerating voltage of the ion beam irradiating respective portions, when an actual specimen, that is, an actual mask or an actual semiconductor device is producted.

Figure 8:
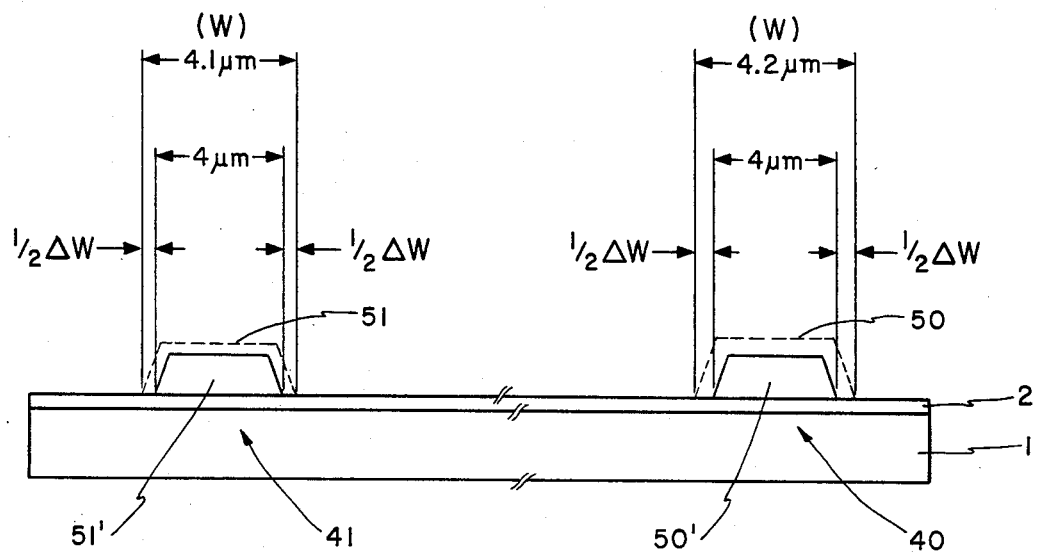
FIG. 8 is a schematic cross-sectional view showing the compensation of the deviation of the resist pattern width by an ion beam irradiation.

Referring to FIG. 8, if the predicted width W is 4.2 μm at the portion 40, the practical pattern 50 would be also of 4.2 μm width. Therefore, the ion beam is enhanced its energy at the portion 40 and the upper and side surfaces thereof are removed by the ion beam by 0.1 μm, that is, ½ ΔW is 0.1 μm so that a resist pattern 50' having the designed width of 4.0 μm is obtained at the portion 40. The ion beam scanned or moved from the portion 40 to portion 41. If the predicted width W is 4.1 μm at the portion 41, the practical pattern 51 would be also of 4.1 μm width. When the ion beam is positioned at the portion 41, the energy is decreased so that the side and upper surfaces of the resist pattern 51 are slightly removed by 0.05 μm, that is, ½ ΔW is 0.05 μm and the resist pattern 51' having the design width of 4.0 μm is obtained. For example, when Ga+ ion beam of 0.5 A/cm² and 1 μm φ diameter is scanned at the speed of 350 mm/sec, if the accelerating voltage of the ion beam is changed from 40 KV to 60 KV, the removed width ($\Delta W$) of the resist can be changed from 100 Å to 1000 Å.

Figure 10:
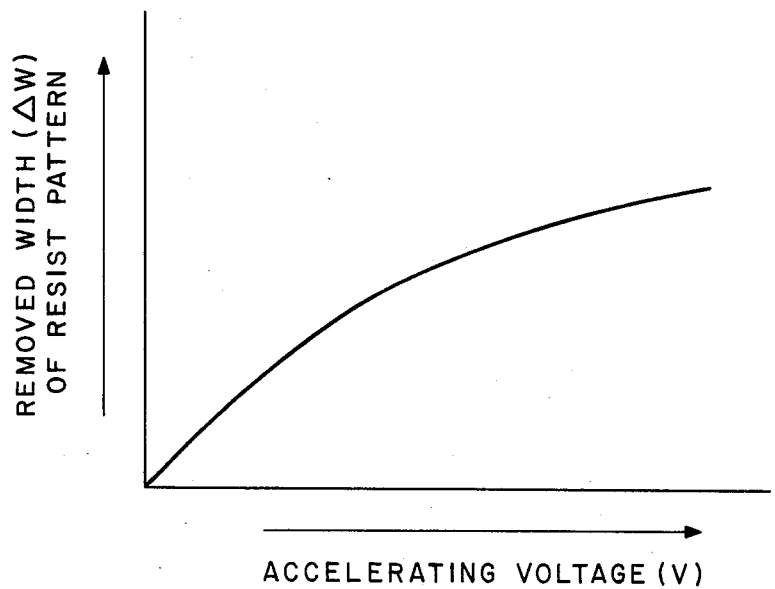
FIG. 10 is a graph showing the relation between an amount of removed width of the resist pattern width by the ion beam irradiation and an ion accelerating voltage of the ion beam.
Figure 9:
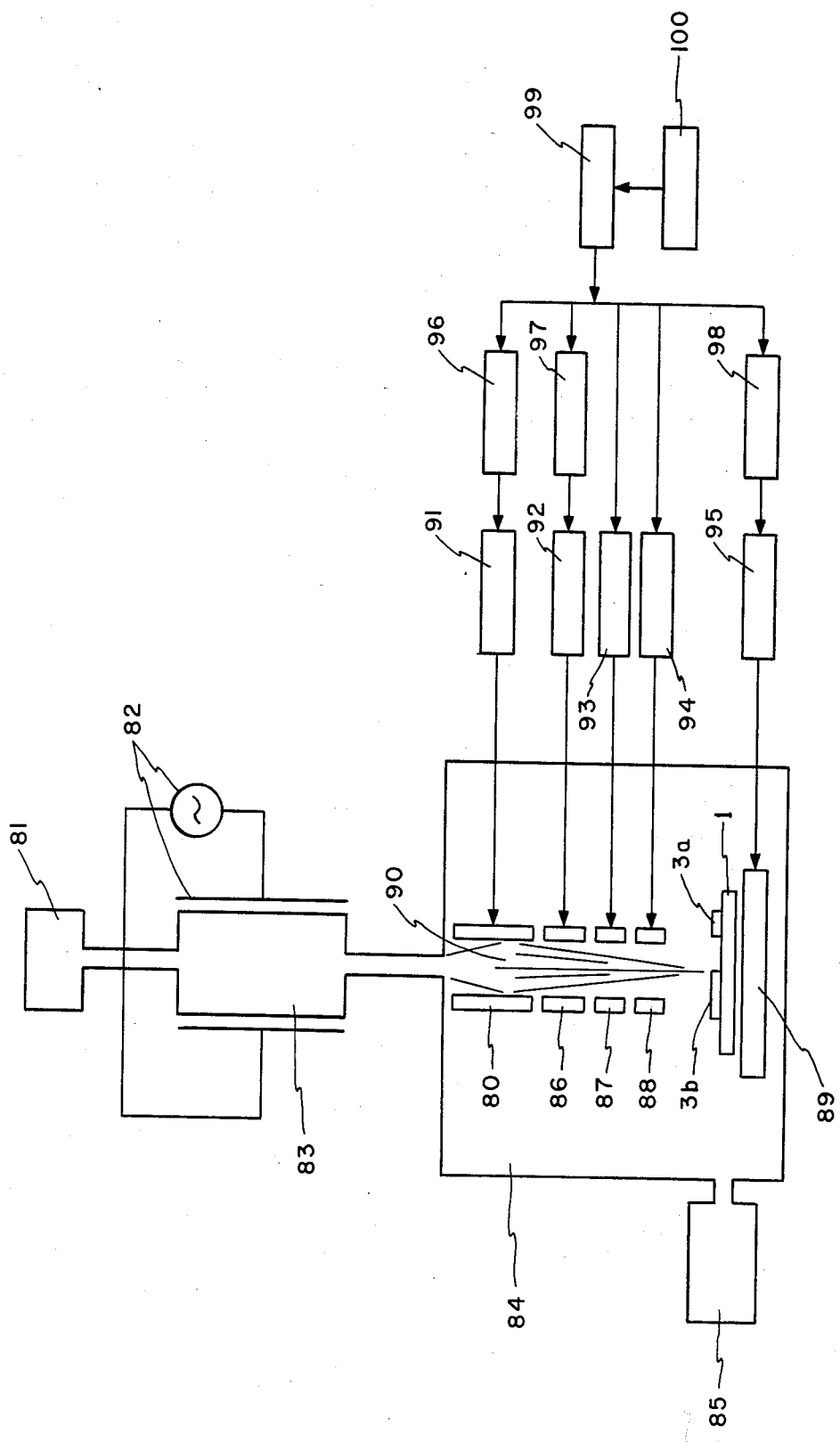
FIG. 9 is a schematic view including a block diagram showing a processing equipment employed in the present invention.

Referring to FIG. 9, the equipment of the ion beam processing equipment used in the present invention is shown. An ion generation chamber 83 is connected to a gas supplying chamber 81 and to a vacuum chamber 84. Outside the ion generation chamber 82, an ion generation power supply and its electrode 82 are installed. A vacuum pump 85 is coupled to the vacuum chamber 84, and in the vacuum chamber 84, an accelerating electrode 80, a focusing electrode 86, a blanking electrode 87, a deflection electrode 88 and an X-Y stage 89 installing the mask substrate are provided. An ion beam 90 from the chamber 83 is irradiated on the resist patterns 3a, 3b on the substrate 1 through the electrodes 80, 86, 87, 88. The electrode 80 is connected to an accelerating voltage power source 91 controlled by an accelerating voltage control section 96 and the focusing electrode 86 is connected to a focusing voltage power source 92 controlled by a focusing voltage control section 97. The blanking electrode 87 is connected to a blanking voltage power source 93, and the deflection electrode 88 is connected to a deflection voltage power source 94. The X-Y stage 89 is moved in X and Y directions by a pair of motors 95 each controlled by a stage control section 98. The accelerating voltage control section 96, the focusing voltage control section 97, the blanking voltage power source 93, the deflection voltage power source 94 and the stage control section 98 are coupled to a converting unit 99 which is coupled to a data input unit 100. A predicted deviation resist pattern width data $P_V$ is input to the data input unit 100, and in which the data is normalized on a basis of the minimum width value being zero. The normalized data is sent to the converting unit 99. In the converting unit 99, the optimum accelerating voltages in respective portions are estimated by the normalized data and a relation between an accelerating voltage and an amount of the removal of the resist shown in FIG. 10 stored in the converting unit 99 beforehand. The estimated data is sent to the accelerating unit 96 which controls the accelerating voltage power source 91 by the estimated data to supply optimum voltages to the accelerating electrode 80 corresponding to the every portions of the ion beam 90 on the resist patterns. Also, best focusing conditions are obtained in the respective accelerating voltage levels by the focusing voltage control section 97, the focusing voltage power source 92 and the focusing electrode 86. The ion beam 90 is scanned within one segment 11 (FIG. 2), for example, on the substrate by the deflection electrode 88, and after scanning within one segment, the substrate 1 is moved by the X-Y stage 89 so that the next segment 11 is positioned under the ion beam.

Turning to FIG. 2, the predicted deviation data of the resist pattern are provided against respective small segments 11. Therefore, in each segment 11 of 0.4 mm×0.4 mm, the ion beam is scanned with a constant voltage (constant energy), and after scanning the ion beam within one segment 11, the voltage of the ion beam is changed, if necessary, and the substrate is moved by the X-Y stage so that next segment 11 is positioned under the ion beam 90 thereby conducting the ion beam scanning on the next segment with the changed constant voltage. Then all effective areas of the resist pattern consisting of 625 segments in the embodiment are irradiated by the ion beam which varies its energy in every segments so that the deviation of the resist pattern in each segment from the designed value is minimized. In the embodiment, the width of the resist stripe in the resist pattern has been in problem. However, the present invention is also useful when an interval width between resist stripes is in problem. In this case, the interval width becomes broader by irradiating the ion beam. Further, the present invention is useful in any kinds of resist, in positive type or negative type, for example. Moreover, the size of the segments 11 can be changed, if necessary.

What is claimed is:

1. A method of forming resist pattern on a substrate comprising steps of forming a layer to be selectively etched on one major surface of a substrate, coating the surface of said layer with a resist film, selectively exposing said resist film, developing said resist film to form a resist pattern, and irradiating an ion beam on said resist pattern, the energy of said ion beam being changed at every segment areas of said resist pattern on the basis of predicted deviation distribution data of the resist pattern so that the deviation of said resist pattern is minimized.

2. A method of claim 1, in which said predicted deviation distribution data is obtained by examination results for the deviations in a resist pattern caused by coating and developing said resist film.

3. A method of claim 1, in which said predicted deviation distribution data is obtained by examination results for the deviations in a resist pattern caused by coating, selectively exposing and developing said resist film.

4. A method of claim 3, in which said selectively exposing said resist film is conducted through an electron beam exposure method.

5. A method of claim 1, in which said layer is made of metal and/or metal oxide to form an opaque pattern of a mask, and said substrate is a glass substrate of said mask.

6. A method of claim 1, in which said layer is made of conductive material, and said substrate is a semiconductor wafer.

7. A method of claim 1, in which said layer includes an insulating layer, and said substrate is a semiconductor wafer.

8. A method of claim 1, in which said substrate is a membrane of a mask for X-ray lithography.

* * * * *